(12) United States Patent
Horie

(10) Patent No.: US 7,486,218 B2
(45) Date of Patent: Feb. 3, 2009

(54) CYCLIC ANALOG-TO-DIGITAL CONVERTER

(75) Inventor: Masakiyo Horie, Gamagori (JP)

(73) Assignee: Denso Corporation, Kariya (JP)

(*) Notice: Subject to any disclaimer, the term of this patent is extended or adjusted under 35 U.S.C. 154(b) by 0 days.

(21) Appl. No.: 11/902,214

(22) Filed: Sep. 20, 2007

(65) Prior Publication Data

US 2008/0074304 A1    Mar. 27, 2008

(30) Foreign Application Priority Data

Sep. 21, 2006 (JP) .............................. 2006-255739
May 9, 2007 (JP) .............................. 2007-124610

(51) Int. Cl.
*H03M 1/34* (2006.01)

(52) U.S. Cl. ...................... 341/163; 341/155

(58) Field of Classification Search ................. 341/118, 341/120, 155, 163, 158, 159, 161
See application file for complete search history.

(56) References Cited

U.S. PATENT DOCUMENTS 5,416,485 A * 5/1995 Lee .............................. 341/172
5,892,472 A   4/1999 Shu et al.
6,320,530 B1 11/2001 Horie
6,836,236 B2 * 12/2004 Horie .......................... 341/155
6,927,723 B2 *  8/2005 Nomasaki et al. ........... 341/172
7,173,556 B2 *  2/2007 Kobayashi et al. .......... 341/161
7,405,681 B2 *  7/2008 Jonsson et al. .............. 341/120

FOREIGN PATENT DOCUMENTS

EP    1 679 798 A1   7/2006
JP    A-2005-260449  9/2005
JP    A-2007-36580   2/2007

OTHER PUBLICATIONS

T. Matsuura, et al., "A 10-bit 3-Msample/s CMOS Multipath Multibit Cyclic ADC," IEICE Trans. Electron., vol. E83-C, No. 2 (Feb. 2000).

* cited by examiner

*Primary Examiner*—Brian Young
(74) *Attorney, Agent, or Firm*—Posz Law Group, PLC

(57) ABSTRACT

An A/D converter includes an A/D conversion circuit, a multiplying D/A converter, a switch circuit, and a control circuit. The control circuit prevents an A/D output of the A/D conversion circuit from being input to the D/A converter and controls the switch circuit so that an input voltage to be A/D-converted is recycled through the switch circuit and the multiplying D/A converter. As a result, the input voltage is amplified to a suitable level for A/D conversion. Then, the control circuit allows the A/D output to be inputted to the D/A converter and controls the switch circuit so that the amplified voltage is recycled through the switch circuit, the multiplying D/A converter, and the A/D conversion circuit. As a result, the amplified voltage is A/D-converted.

11 Claims, 14 Drawing Sheets

FIG. 16
| CHANNEL | INPUT SIGNAL | INPUT RANGE | GAIN | AMPLIFIED RANGE | RESOLUTION |
|---|---|---|---|---|---|
| Ch1 | ACCELERATION | 15mV | $2^8=256$ | 3.84V | 0.019mV |
| Ch2 | TEMPERATURE | 500mV | $2^3=8$ | 4.0V | 0.61mV |
| Ch3 | BATTERY | 5V | 1 | 5.0V | 4.88mV |
FIG. 17
PRIOR ART
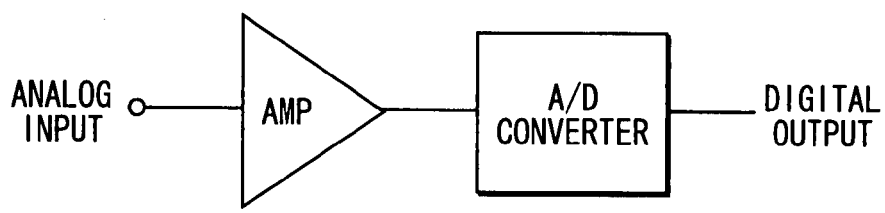
FIG. 18A
PRIOR ART
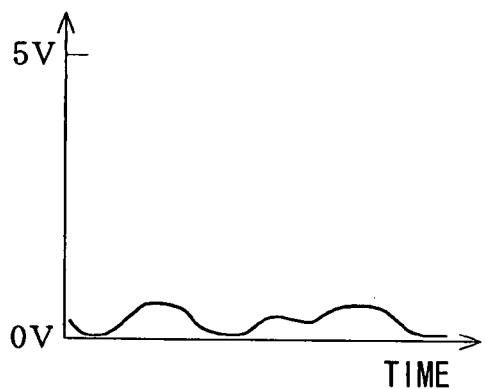
FIG. 18B
PRIOR ART
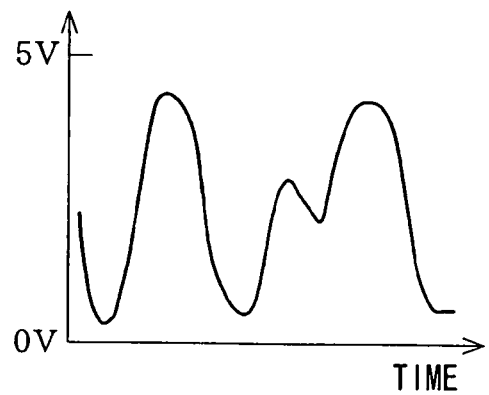

US 7,486,218 B2

CYCLIC ANALOG-TO-DIGITAL CONVERTER

CROSS CHECK TO RELATED APPLICATION

This application is based on and incorporates herein by reference Japanese Patent Applications No. 2006-255739 filed on Sep. 21, 2006 and No. 2007-124610 filed on May 9, 2007.

FIELD OF THE INVENTION

The present invention relates to a cyclic analog-to-digital converter.

BACKGROUND OF THE INVENTION

Typically, an output level of a vehicle sensor such as an acceleration sensor or a pressure sensor is very small and between a few millivolts to hundreds of millivolts, for example. In contrast, an analog-to-digital (A/D) converter built in a vehicle microcomputer typically has a dynamic range from 0 volts to 5 volts. Therefore, when the sensor output is A/D-converted by the A/D converter, the dynamic range cannot be used effectively. As a result, an A/D output of the A/D converter has poor precision.

As shown in FIG. 17, one approach to improve the precision of the A/D output is to provide an amplifier circuit with a suitable gain upstream of the A/D converter. As shown in FIGS. 18A, 18B, a small sensor output is amplified to a suitable level for A/D conversion by the amplifier circuit according to a kind of sensors, signal level of the sensor output, or the like. In such an approach, the dynamic range of the A/D converter can be used effectively so that the precision of the A/D output can be increased.

For example, in U.S. Pat. No. 5,892,472, multiple amplifier circuits (i.e., switched capacitor circuits) having adjustable gains are provided upstream of the A/D converter. However, the multiple amplifier circuits result in an increase in IC chip size. Further, since the multiple amplifier circuits are connected in series, errors such as an offset error, a gain error, and a linearity error are accumulated. As a result, the A/D output of the A/D converter may have poor precision. The errors may be reduced by adding correction circuits to the A/D converter. However, the addition of the correction circuits results in the increase in IC chip size.

Another approach to improve the precision of the A/D output is to increase resolution of the A/D converter. However, it is generally difficult to increase the resolution. In an A/D converter disclosed in JP-A-2005-260449, a conversion resolution is reduced according to an input signal so that quantization width is equalized. However, this approach does not use the dynamic range effectively and cannot increase the resolution.

SUMMARY OF THE INVENTION

In view of the above-described problem, it is an object of the present invention to provide an A/D converter with an amplification function.

An A/D converter includes an A/D conversion circuit, a residue voltage generation circuit, a signal terminal, a switch circuit, and a control circuit. The residue voltage generation circuit has an input terminal connected to an input of the A/D conversion circuit and generates a residue voltage by amplifying a difference between an input voltage applied to the input terminal and a reference analog voltage. The signal terminal receives an external signal voltage to be A/D converted. The switch circuit has a first end connected to the input terminal and a second end connectable to the signal terminal or an output terminal of the residue voltage generation circuit. The control circuit performs an amplification operation and an A/D conversion operation followed by the amplification operation.

In the amplification operation, the control circuit keeps the reference analog voltage at a predetermined voltage level. Further, the control circuit controls the switch circuit so that the external signal voltage is applied as the input voltage to the input terminal of the residue voltage generation circuit. An output voltage of the residue voltage generation circuit is recycled through the switch circuit and the residue voltage generation circuit a first certain number of times. In such an approach, the external signal voltage is amplified to a suitable level for A/D conversion.

In the A/D conversion operation, the control circuit changes the reference analog voltage according to a digital value outputted from the A/D conversion circuit. The amplified voltage having the suitable level for A/D conversion is recycled through the switch circuit, the A/D conversion circuit, and the residue voltage generation circuit a second certain number of times. Thus, the amplified voltage, i.e., the external signal voltage is A/D-converted.

BRIEF DESCRIPTION OF THE DRAWINGS

The above and other objectives, features and advantages of the present invention will become more apparent from the following detailed description made with check to the accompanying drawings. In the drawings:

FIG. 16 is table showing a gain of each channel of the multi-channel A/D conversion system of FIG. 15;

FIG. 17 is a block diagram of a conventional structure with an amplifier circuit and an A/D converter; and FIG. 18A is a graph showing an input signal of the amplifier circuit of FIG. 17, and FIG. 18B is a graph showing an output signal of the amplifier circuit of FIG. 17.

DETAILED DESCRIPTION OF THE PREFERRED EMBODIMENTS

First Embodiment

Figure 1:
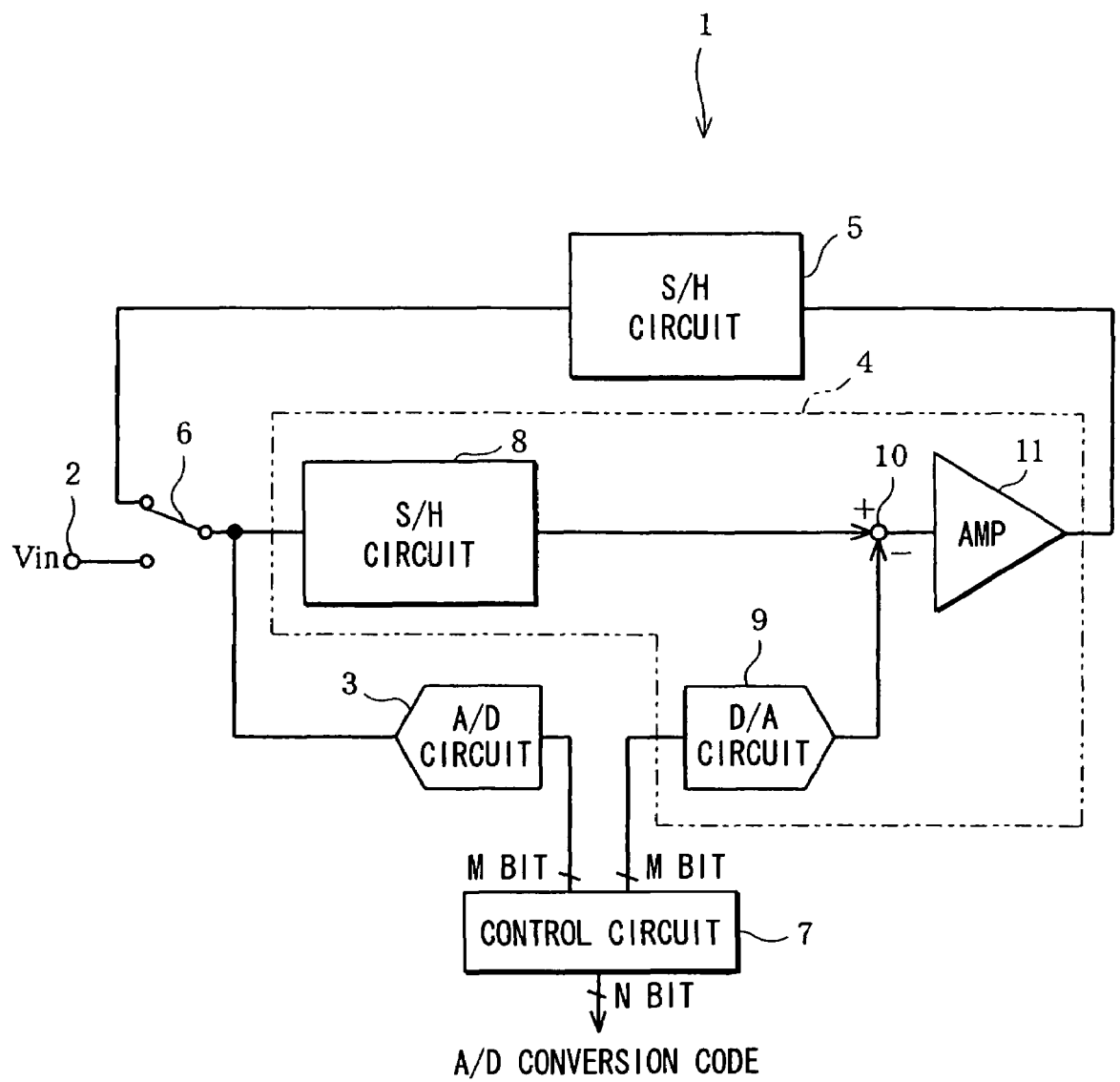
FIG. 1 is a block diagram of a cyclic A/D converter according to a first embodiment of the present invention.

As shown in FIG. 1, a cyclic analog-to-digital (A/D) converter 1 according to a first embodiment of the present invention includes a signal input terminal 2, a M-bit A/D conversion circuit 3, a M-bit multiplying digital-to-analog (D/A) converter 4 (i.e., residue voltage generation circuit), a sample and hold circuit 5, a switch circuit 6, and a control circuit 7, where M is a positive number. The cyclic A/D converter 1 amplifies an input signal voltage Vin (i.e., external signal voltage) applied to the signal input terminal 2 and performs A/D conversion of the amplified voltage to produce an N-bit A/D conversion code, where N is a positive number. The cyclic A/D converter 1 may be, for example, used in a control integrated circuit (IC) for a vehicle.

The sample and hold circuit 5 samples and holds an output voltage (i.e., amplified voltage or residue voltage) of the multiplying D/A converter 4. The switch circuit 6 selects one of the input signal voltage Vin and the output voltage of the sample and hold circuit 5 and outputs the selected voltage to each of the A/D conversion circuit 3 and the multiplying D/A converter 4.

The multiplying D/A converter 4 includes a sample and hold circuit 8, a M-bit D/A conversion circuit 9, a subtractor circuit 10, and an amplifier circuit 11. The multiplying D/A converter 4 amplifies a difference between an input voltage to the A/D conversion circuit 3 and an analog voltage into which a digital value outputted from the control circuit 7 is converted. The subtractor circuit 10 subtracts an output voltage of the D/A conversion circuit 9 from an output voltage of the sample and hold circuit 8.

Figure 2:
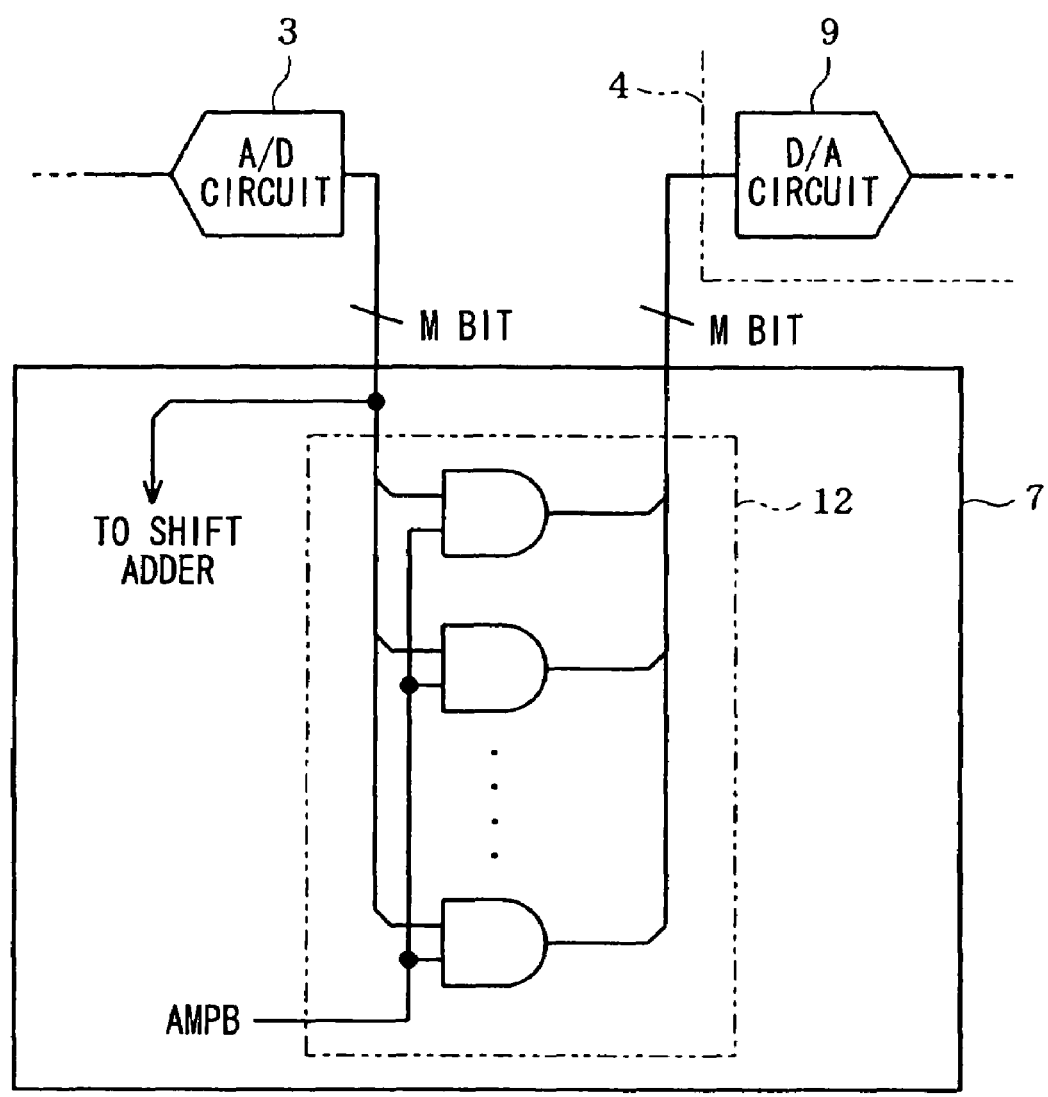
FIG. 2 is a circuit diagram of a control circuit in the cyclic A/D converter of FIG. 1.

As shown in detail in FIG. 2, the control circuit 7 includes an AND circuit 12 for switching between an amplification operation and an A/D conversion operation. The AND circuit 12 has M AND logic gates. Each AND gate of the AND circuit 12 has a first input for receiving one bit of M-bit A/D output of the A/D conversion circuit 3 and a second input for receiving a switching signal AMPB.

Thus, the AND circuit 12 of the control circuit 7 outputs a M-bit AND signal (i.e., digital value) to the D/A conversion circuit 9 of the multiplying D/A converter 4. The switching signal is kept at a low level during the amplification operation and kept at a high level during the A/D conversion operation. As shown in FIG. 2, the control circuit 7 is configured as a logic circuit. Alternatively, the control circuit 7 may be configured as a microcomputer.

Figure 3:
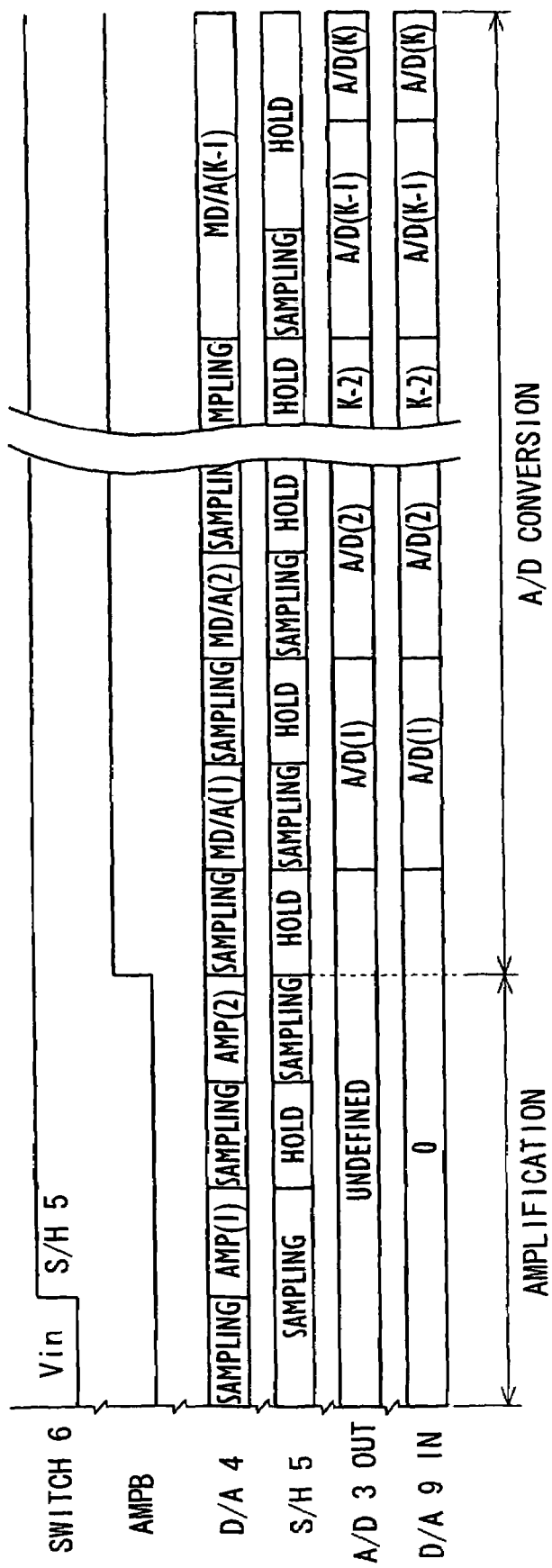
FIG. 3 is a timing diagram of the cyclic A/D converter of FIG. 1.

The cyclic A/D converter 1 operates as shown in FIG. 3. The cyclic A/D converter 1 amplifies the input signal voltage Vin by using the multiplying D/A converter 4, the sample and hold circuit 5, and the switch circuit 6. Then, the cyclic A/D converter 1 performs the A/D conversion of the amplified voltage by using the A/D conversion circuit 3.

(Amplification Operation)

The control circuit 7 changes the switching signal AMPB to the low level so that the M-bit AND signal, which is inputted from the control circuit 7 to the D/A conversion circuit 9, has a digital value of zero. As a result, the output voltage of the D/A conversion circuit 9 is set to zero (i.e., predetermined voltage level). Then, the control circuit 7 switches the switch circuit 6 to the signal input terminal 2 so that the multiplying D/A converter 4 samples and holds the input signal voltage Vin.

After the multiplying D/A converter 4 holds the input signal voltage Vin, the control circuit 7 switches the switch circuit 6 to the sample and hold circuit 5 so that the multiplying D/A converter 4 performs an amplification operation of the input signal voltage Vin. Specifically, in the multiplying D/A converter 4, the subtractor circuit 10 subtracts the output voltage (i.e., zero volts) of the D/A conversion circuit 9 from the input signal voltage Vin held by the sample and hold circuit 8. Then, the subtracted voltage is amplified by the amplifier circuit 11. The multiplying D/A converter 4 outputs the amplified voltage to the sample and hold circuit 5 during a period Amp (1) shown in FIG. 3. The sample and hold circuit 5 samples and holds the amplified voltage outputted from the multiplying D/A converter 4.

In this embodiment, the amplification operation is performed twice to amplify the input signal voltage Vin with a high gain. Specifically, the amplified voltage held by the sample and hold circuit 5 is recycled through the switch circuit 6 and the multiplying D/A converter 4. Thus, the input signal voltage Vin is amplified twice. The multiplying D/A converter 4 outputs the twice amplified voltage to the sample and hold circuit 5 during a period Amp (2) shown in FIG. 3. The sample and hold circuit 5 samples and holds the twice amplified voltage outputted from the multiplying D/A converter 4. The second amplification operation is completed when the twice amplified voltage is held by the sample and hold circuit 5.

(A/D Conversion Operation)

Then, the control circuit 7 changes the switching signal AMPB to the high level so that the M-bit AND signal, which is inputted from the control circuit 7 to the D/A conversion circuit 9, can have a digital value corresponding to the input voltage to the A/D conversion circuit 3. As a result, the output voltage of the D/A conversion circuit 9 has a value corresponding to the M-bit AND signal.

The twice amplified voltage held by the sample and hold circuit 5 is inputted to each of the A/D conversion circuit 3 and the multiplying D/A converter 4. While the sample and hold circuit 8 of the multiplying D/A converter 4 samples the twice amplified voltage, the A/D conversion circuit 3 converts the twice amplified voltage into an A/D output indicated as A/D (1) in FIG. 3. The A/D conversion timing, at which the output of the A/D conversion circuit 3 varies, can be different from that shown in FIG. 3, as long as the A/D conversion timing is within a period of time when the twice amplified voltage is held by the sample and hold circuit 5. The control circuit 7 sends the A/D output to a shift adder circuit (not shown).

In the multiplying D/A converter 4, the subtractor circuit 10 subtracts the output voltage of the D/A conversion circuit 9 from the twice amplified voltage held by the sample and hold circuit 5. Then, the subtracted voltage is amplified by the amplifier circuit 11. The multiplying D/A converter 4 outputs the amplified voltage (i.e., residue voltage) to the sample and hold circuit 5 during a period MD/A(1) shown in FIG. 3. The sample and hold circuit 5 samples and holds the residue voltage outputted from the multiplying D/A converter 4.

The control circuit 7 causes the residue voltage held by the sample and hold circuit 5 to be recycled through the switch circuit 6, the A/D conversion circuit 3, and the multiplying D/A converter 4. In the A/D conversion operation, when the residue voltage passes through the multiplying D/A converter 4 (K−1) times, the A/D conversion circuit 3 performs the A/D conversion K times, where K is a positive integer. Each time the A/D conversion is performed, the A/D output of the A/D conversion circuit 3 is added to each other by the shift-adder in the control circuit 7. As a result, the control circuit 7 produces the N-bit A/D conversion code. The number N is given as follows:

$$N = K \cdot (M-1)$$

If the number M is 1.5, the number M is calculated as 2 so that the number N becomes equal to the number K (i.e., N=K).

As described above, according to the cyclic A/D converter 1, the input signal voltage Vin is recycled through the multiplying D/A converter 4 a certain number of times. In such an approach, the input signal voltage Vin is amplified by a desired gain and has a suitable voltage level for A/D conversion. Therefore, the cyclic A/D converter 1 can amplify a small signal of between a few millivolts and several hundreds of millivolts up to a dynamic range of the A/D conversion circuit 3. For example, the dynamic range is between 0 volts and 5 volts. In such a approach, the dynamic range can be used effectively so that precision of the A/D output can be increased, i.e., resolution of the A/D conversion circuit 3 can be substantially increased.

Further, according to the cyclic A/D converter 1, the amplification operation is performed with circuit elements which a cyclic A/D converter inherently has. In other words, the amplification operation is performed without additional circuit elements. Specifically, there is no need to provide an amplifier circuit upstream of the A/D conversion circuit 3. Therefore, structure of the cyclic A/D converter 1 can be simplified so that the cyclic A/D converter 1 can be small in size.

Typically, a D/A converter, i.e, the multiplying D/A converter 4 has high precision to achieve high precision for conversion. Therefore, the multiplying D/A converter 4 acts as a very accurate amplifier with a low offset voltage and a high linearity. Further, the gain depends on the number of times the voltage passes through the multiplying D/A converter 4. The multiplying D/A converter 4 acts as a programmable amplifier with a variable gain.

Second Embodiment

As shown in FIGS. 4-7, a cyclic A/D converter 13 according to a second embodiment of the present invention includes a signal input terminal 2, a 1.5-bit A/D conversion circuit 3, a sample and hold circuit 5, a switch circuit 6, a 1.5-bit multiplying D/A converter 14 (i.e., residue voltage generation circuit), and a control circuit 20. The A/D conversion circuit 3 has an upper reference voltage Vrefp of five volts and a lower reference voltage Vrefm of zero volts and outputs an A/D output, which is a 1.5-bit digital value. Specifically, the A/D conversion circuit 3 outputs three binary values "00", "01", "10", corresponding to three decimal values "0", "1", "2", respectively.

Figure 5:
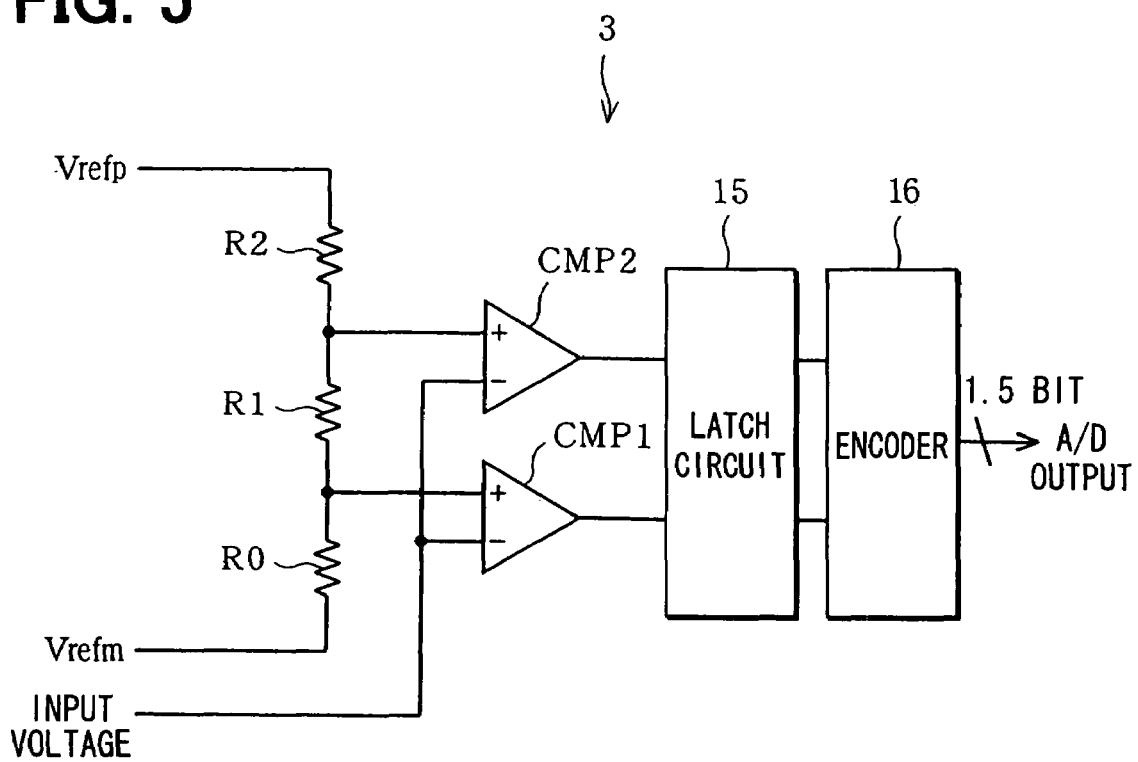
FIG. 5 is a circuit diagram of an A/D conversion circuit in the cyclic A/D converter of FIG. 4.

As shown in FIG. 5, the A/D conversion circuit 3 includes a latch circuit 15, an encoder circuit 16, comparator circuits CMP1, CMP2, and a voltage divider circuit constructed with resistors R0-R2. A difference between the upper and lower reference voltages Vrefp, Vrefm are divided by the voltage divider circuit. A node between the resistors R0, R1 is connected to a non-inverting input terminal of the comparator circuit CMP1. A node between the resistors R1, R2 is connected to a non-inverting input terminal of the comparator circuit CMP2. An input voltage is applied through the switch circuit 6 to each inverting input terminal of the comparator circuits CMP1, CMP2. Resistances of the resistors R0-R2 are set as follows:

R0:R1:R2=1.5:1:1.5

For example, therefore, when the resistor R1 has a resistance of 10Ω, each of the resistors R0, R2 has a resistance of 15 Ω.

Each output terminal of the comparator circuits CMP1, CMP2 is connected to the encoder circuit 16 through the latch circuit 15. When a latch signal inputted to the latch circuit 15 is at the high level, the latch circuit 15 latches output signals of the comparator circuits CMP1, CMP2 and outputs the latched signals to the encoder circuit 16. The encoder circuit 16 generates and outputs the A/D output (i.e., "00", "01", or "10") in accordance with the output signals of the latch circuit 15.

Figure 4:
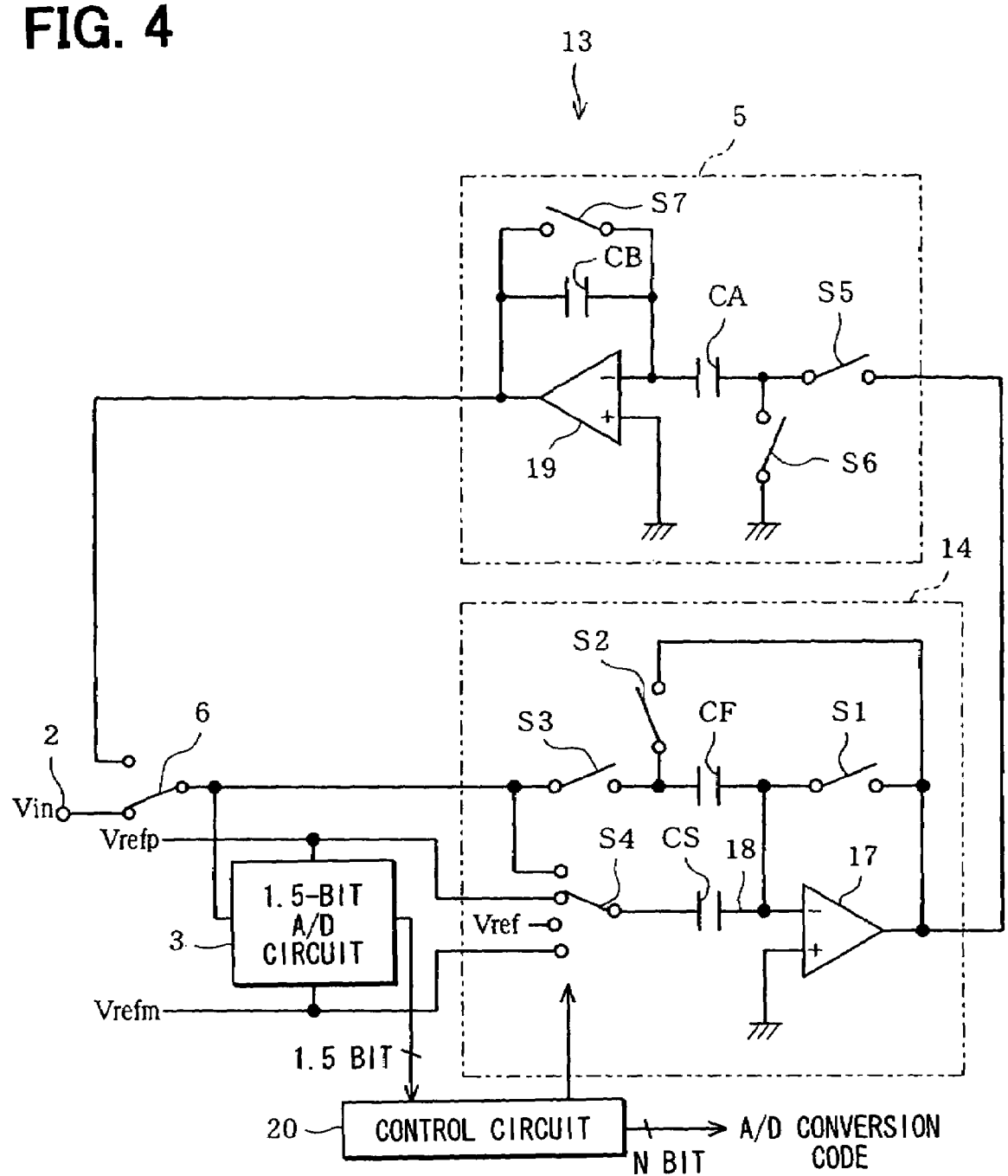
FIG. 4 is a block diagram of a cyclic A/D converter according to a second embodiment of the present invention.

As shown in FIG. 4, the multiplying D/A converter 14 includes an operational amplifier 17, capacitors CS, CF, and switches S1-S4. The operational amplifier 17 has an non-inverting input terminal connected to a ground line and an inverting input terminal connected to a common line 18. The capacitor CS has a first electrode connected to the common line 18 and a second electrode connected to one of reference voltage lines and the switch circuit 6 through the switch S4. The reference voltage lines are connected to the upper reference voltage Vrefp of 5 volts, a reference voltage Vref of 2.5 volts, and a lower reference voltage Vrefm of 0 volts, respectively.

The switch S1 is connected between the inverting input terminal and an output terminal of the operational amplifier 17. The switch S3 and the capacitor CF are connected in series between the switch circuit 6 and the inverting input terminal of the operational amplifier 17. The switch 2 is connected between the output terminal of the operational amplifier 17 and an node between the switch S3 and the capacitor CF. The capacitor CF is connected between the inverting input terminal and the output terminal of the operational amplifier 17, when the switch S1 is off, and the switch S2 is on.

As shown in FIG. 4, the sample and hold circuit 5 includes an operational amplifier 19, switches S5-S7, and capacitors CA, CB. The switch S5 and the capacitor CA are connected in series between an inverting input terminal of the operational amplifier 19 and the multiplying D/A converter 14. The switch S6 is connected between the ground line and an node between the switch S5 and the capacitor CA. The switch S7 and the capacitor CB are connected in parallel between the inverting input terminal and an output terminal of the operational amplifier 19.

Figure 6:
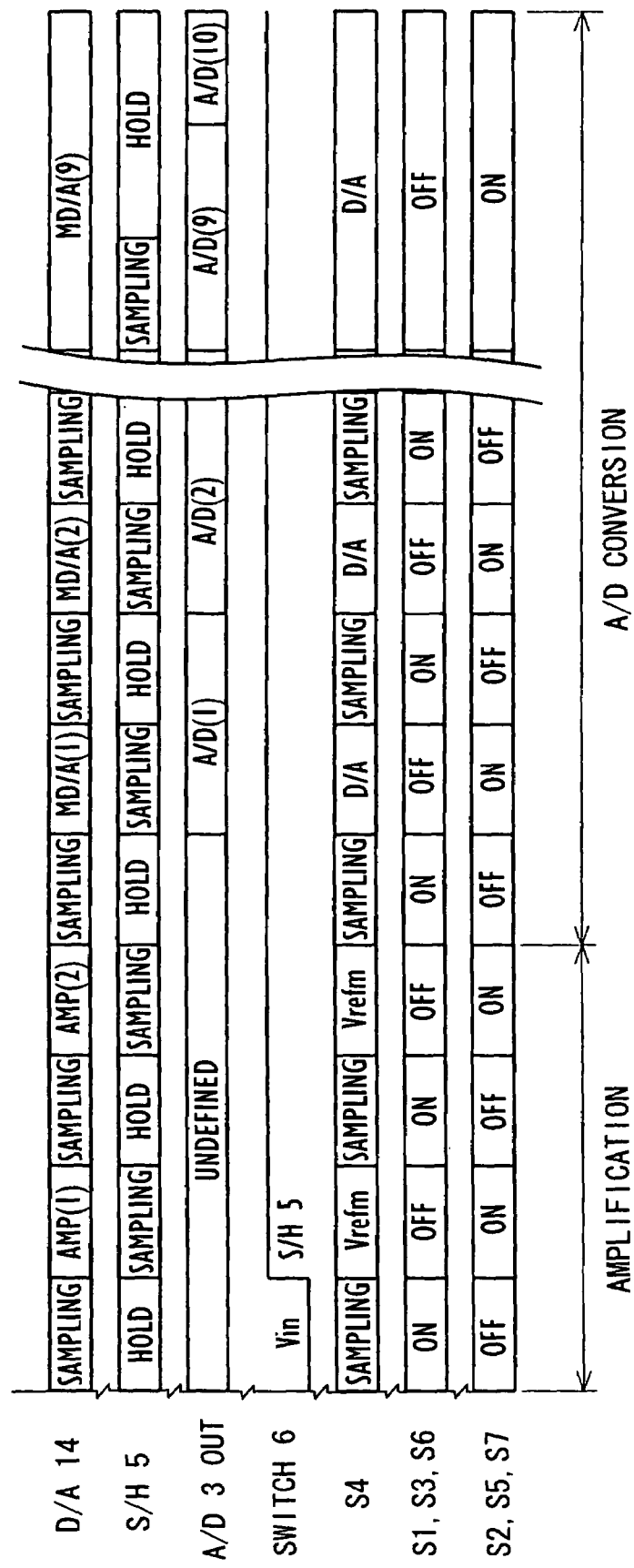
FIG. 6 is a timing diagram of the cyclic A/D converter of FIG. 4.

The operation of the cyclic A/D converter 13 is described below with reference to FIGS. 6, 7.

(Amplification Operation)

The control circuit 20 switches the switch circuit 6 to the signal input terminal 2, switches the switch S4 to the switch circuit 6, turns on the switches S1, S3, and turns off the switch S2, so that the capacitors CF, CS are charged by the input signal voltage Vin. Then, the control circuit 20 switches the switch circuit 6 to the sample and hold circuit 5, switches the switch S4 to the reference voltage Vrefm, turns off the switches S1, S3, S6, and turns on the switches S2, S5, S7. Thus, the multiplying D/A converter 14 performs an amplification operation, and the sample and hold circuit 5 performs a sampling operation during a period Amp(1) shown in FIG. 6. Specifically, the capacitor CF is connected between the inverting input terminal and the output terminal of the operational amplifier 17. The charge is redistributed between the capacitors CF, CF in accordance with the following equations:

$$(Cf+Cs)(Vin-0) = Cs(0-0) + Cf(Vout-0) \quad (1)$$

In the above equation (1), Cf, Cs represent capacitances of the capacitors CF, CS, respectively, and Vout represents an output voltage of the operational amplifier 17. From the equation (1), the output voltage Vout of the operational amplifier 17 is given as follows:

$$Vout = (Cf+Cs)/Cf \cdot Vin \quad (2)$$

Therefore, if the capacitance Cf is equal to the capacitance, the input signal voltage Vin is amplified by a gain of two each time passing through the multiplying D/A converter 14.

In this embodiment, the amplification operation of the input signal voltage Vin is performed twice to amplify the input signal voltage Vin by a high gain. In the second amplification operation, the control circuit 20 turns on the switch S6, and turns off the switches S5, S7, so that the sample and hold circuit 5 holds the output voltage Vout of the multiplying D/A converter 14. Then, the output voltage Vout held by the sample and hold circuit 5 is recycled through the switch circuit 6 and the multiplying D/A converter 14 so that the amplification operation is performed twice.

Specifically, in the second amplification operation, the control circuit 20 switches the switch S4 to the switch circuit 6, turns on the switches S1, S3, and turns off the switch S2, so that the capacitors CF, CS are charged by the output voltage Vout. Then, the control circuit 20 switches the switch S4 to the reference voltage Vrefm, turns off the switches S1, S3, and turns on the switch S2, so that the charge is redistributed between the capacitors CF, CF during a period Amp(2) shown in FIG. 6. Then, the control circuit 20 turns on the switch S6, and turns off the switches S5, S7, so that the sample and hold circuit 5 holds the twice amplified voltage. The second amplification operation is completed, when the twice amplified voltage is held by the sample and hold circuit 5. As a result, the input signal voltage Vin is amplified by a gain of four.

(A/D Conversion Operation)

Then, the control circuit 20 switches the switch S4 to the switch circuit 6, turns on the switches S1, S3, and turns off the switch S2, so that the capacitors CF, CS are charged by the twice amplified voltage. The control circuit 20 outputs the latch signal of high level to the latch circuit 15 so that the A/D conversion circuit 3 outputs the A/D output (i.e., 1.5-bit digital value) to the control circuit 20.

When the charging of the capacitors CF, CS is finished, the control circuit 20 turns off the switches S1, S3 and turns on the switch S2. Further, the control circuit 20 switches the switch S4 in accordance with the A/D output of the A/D conversion circuit 3, so that the charge is redistributed between the capacitors CF, CS during a period MD/A(1) shown in FIG. 6. At the same time, the control circuit 20 turns off the switch S6 and turns on the switches S5, S7 so that the sample and circuit 5 performs the sampling operation.

Figure 7:
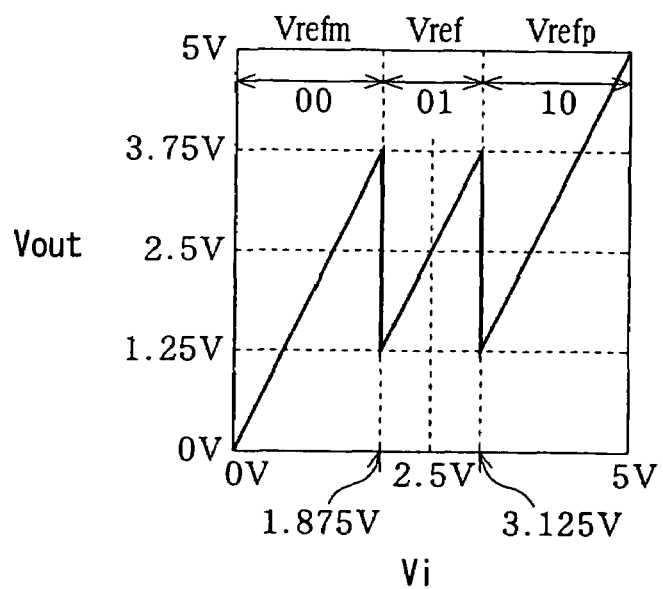
FIG. 7 is a graph showing conversion characteristics of a multiplying D/A converter in the cyclic A/D converter of FIG. 4.

The multiplying D/A converter 14 has conversion characteristics illustrated in FIG. 7. In FIG. 7, horizontal and longitudinal axes represent input and output voltages Vi, Vout of the multiplying D/A converter 14. The relationships between the input voltage Vi, and the A/D output of the A/D conversion circuit 3 and the switching of the switch S4 are as follows:

0V≦Vi<1.875V: A/D output=00, S4=Vrefm
1.875V≦Vi<3.125V: A/D output 01, S4=Vref
3.125V≦Vi<5V: A/D output 10, S4=Vrefp Specifically, when the input voltage Vi is equal to or greater than 0 volts and less than 1.875 volts, the A/D output of the A/D conversion circuit 3 is "00", and the switch S4 is switched to the reference voltage Vrefm. When the input voltage Vi is equal to or greater than 1.875 volts and less than 3.125 volts, the A/D output is "01", and the switch S4 is switched to the reference voltage Vref. When the input voltage Vi is equal to or greater than 3.125 volts and less than 5 volts, the A/D output is "10", and the switch S4 is switched to the reference voltage Vrefp.

The charge is redistributed between the capacitors CF, CF in accordance with the following equations:

$$(Cf+Cs)(Vi-0) = Cs(X \cdot Vref-0) + Cf(Vout-0) \quad (3)$$

In the above equation (3), X represents the decimal value (i.e., 0, 1, or 2) corresponding to the A/D output.

From the equation (3), when Cf=Cs, Vrefp=2Vref, and Vrefm=0, the output voltage Vout is given as follows:

$$Vout = 2(Vi - X(Vref/2)) \quad (4)$$

In the A/D conversion operation, the control circuit 20 causes the output voltage Vout represented by the equation (4) to be recycled through the sample and hold circuit 5, the switch circuit 6, the A/D conversion circuit 3, and the multiplying D/A converter 14. When the output voltage Vout passes through the multiplying D/A converter 14 nine (i.e., K−1) times, the A/D conversion circuit 3 performs the A/D conversion 10 (i.e., K) times. Each time the A/D conversion is performed, the A/D output of the A/D conversion circuit 3 is added to each other by a shift-adder in the control circuit 20. As a result, the control circuit 20 produces a 10-bit A/D conversion code.

In the cyclic A/D converter 13 according to the second embodiment, the input signal voltage Vin passes through the multiplying D/A converter 14 under a condition where a D/A output is forced to set to 0 volts. In such an approach, the input signal voltage Vin can be amplified. In this type of A/D converter, typically, a ratio between the capacitances Cf, Cs is very accurately set. Therefore, the multiplying D/A converter 14 acts as an accurate amplifier with a variable gain.

As described above, the sample and hold circuit 5 samples and holds the output voltage Vout used to charge the capacitors CF, CS at next circulation operation, after the charge redistribution is performed in the multiplying D/A converter 14. Therefore, the sample and hold circuit 5 can be replaced with a pair of another multiplying D/A converter 14 and another A/D conversion circuit 3. In this case, control circuit 20 causes the two multiplying D/A converters 14 to operate reversely. Specifically, when one multiplying D/A converter 14 performs the sampling operation, the other multiplying D/A converter 14 performs the charge redistribution operation. In such an approach, conversion time can be reduced.

Third Embodiment

Figure 8:
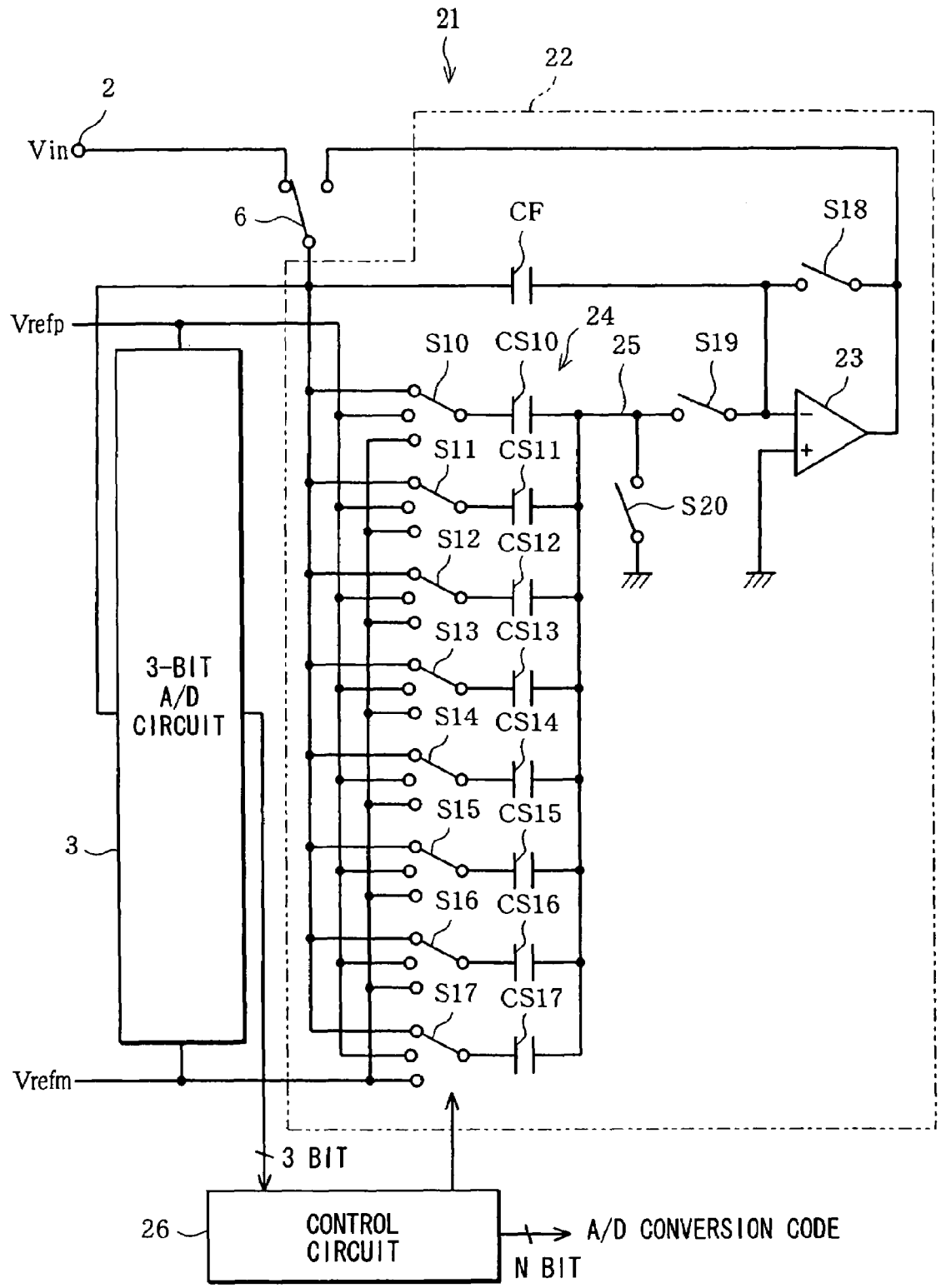
FIG. 8 is a block diagram of a cyclic A/D converter according to a third embodiment of the present invention.
Figure 9:
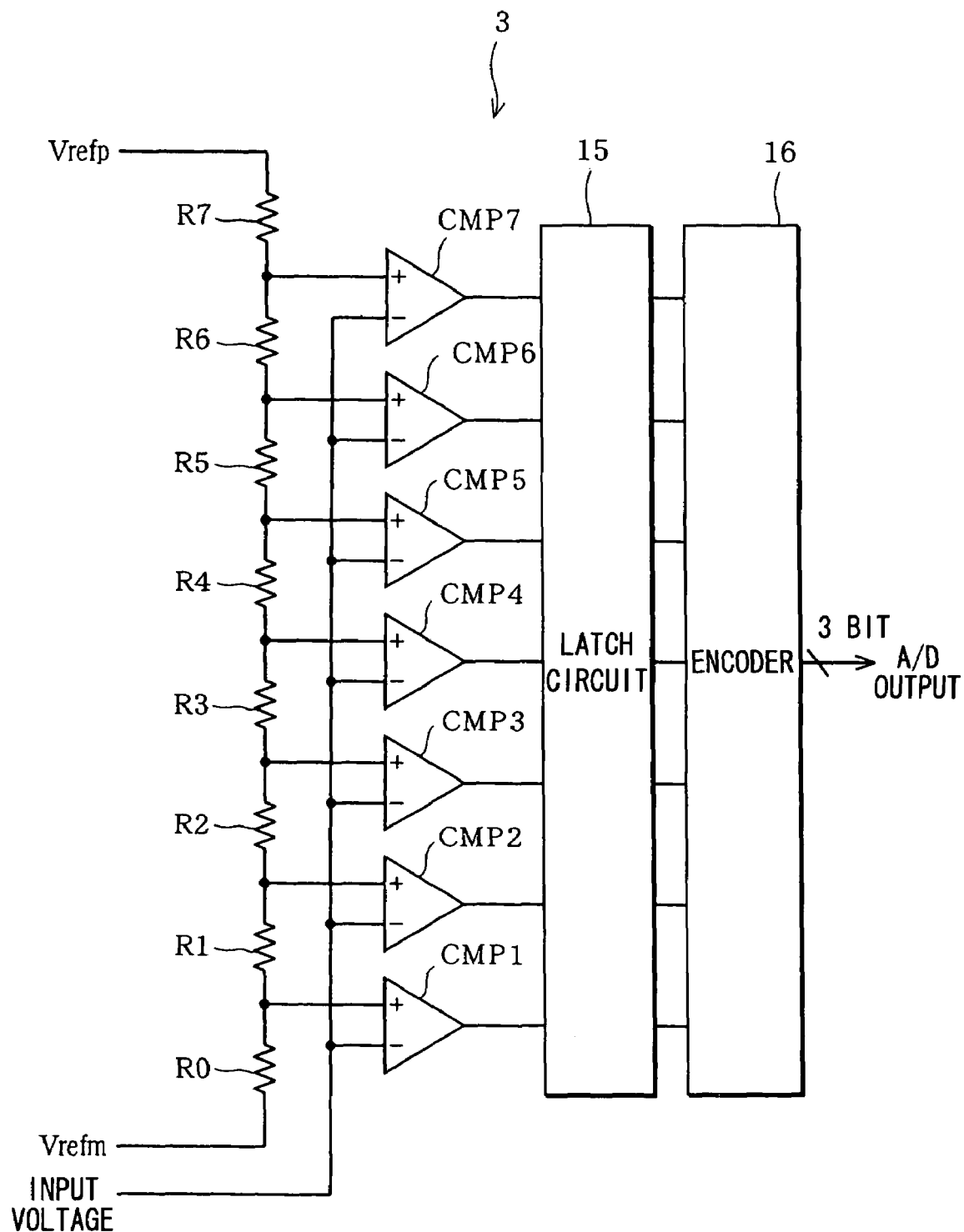
FIG. 9 is a circuit diagram of an A/D conversion circuit in the cyclic A/D converter of FIG. 8.
Figure 10:
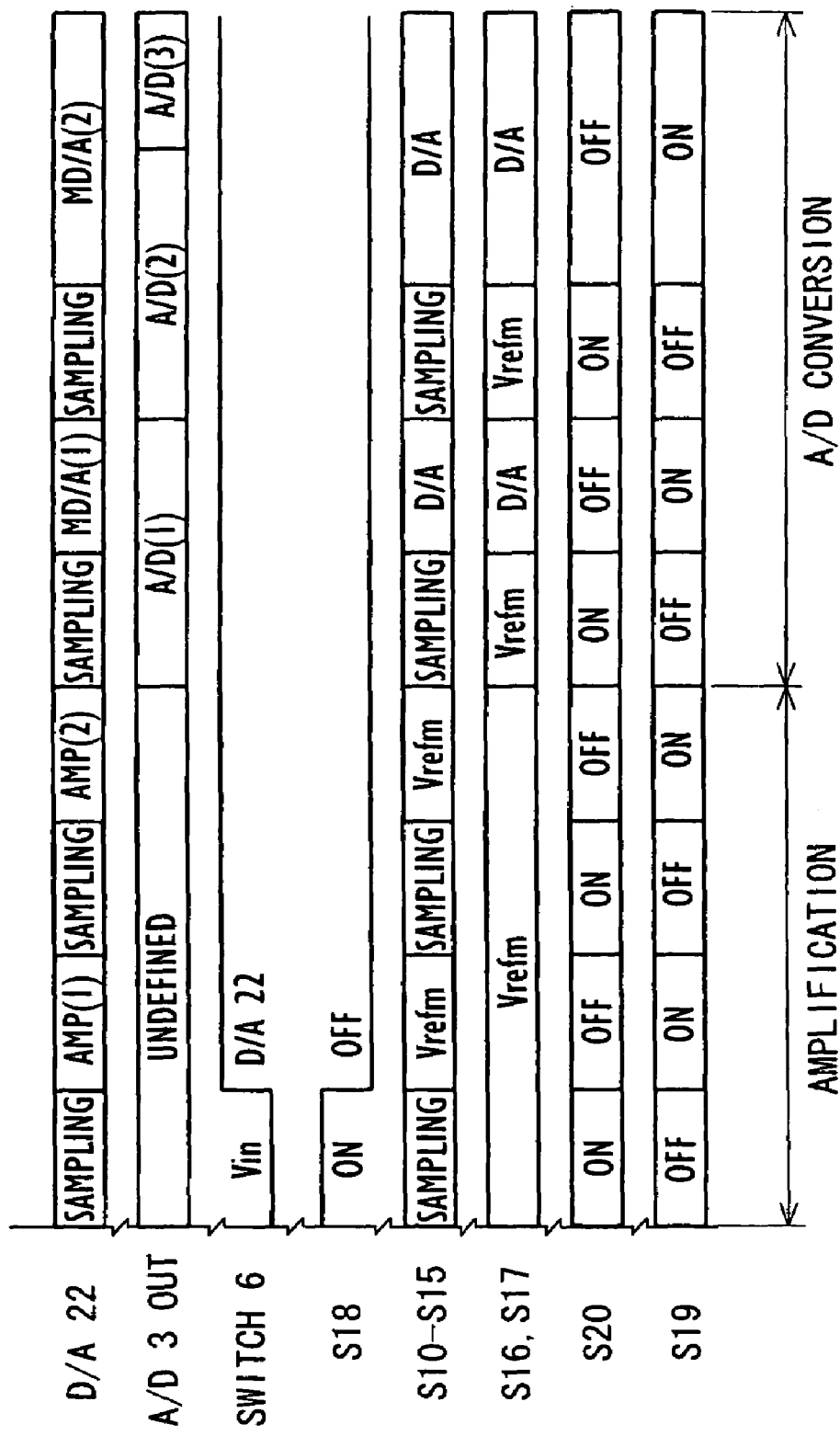
FIG. 10 is a timing diagram of the cyclic A/D converter of FIG. 8.

As shown in FIGS. 8-10, a cyclic A/D converter 21 according to a third embodiment of the present invention includes a signal input terminal 2, a 3-bit A/D conversion circuit 3, a switch circuit 6, a 3-bit multiplying D/A converter 22 (i.e., residue voltage generation circuit), and a control circuit 26.

The multiplying D/A converter 22 combines functions of the multiplying D/A converter 4 and the sample and hold circuit 5 shown in FIG. 1. As shown in FIG. 8, the multiplying D/A converter 22 includes an operational amplifier 23, a capacitor array circuit 24, an integrator capacitor CF, and switches S10-S20.

The capacitor array circuit 24 includes eight capacitors CS10-CS17, each of which has a capacitance C. In short, all the capacitors CS10-CS17 have the same capacitance. Each of the capacitors CS10-CS17 has a first electrode connected to a common line 25 and a second electrode connected to one of reference voltage lines and the switch circuit 6 via the switches S10-S17. The reference voltage lines are connected to an upper reference voltage Vrefp of 5 volts and a lower reference voltage Vrefm of 0 volts, respectively.

The common line 25 is connected to an inverting input terminal of the operational amplifier 23 through the switch S19 (i.e. first switch). Further, the common line 25 is connected to a ground line through the switch S20 (i.e., second switch). The switch S18 is connected between the inverting input terminal and an output terminal of the operational amplifier 23. The integrator capacitor CF is connected between the switch circuit 6 and the inverting input terminal of the operational amplifier 23. The integrator capacitor CF has a capacitance 2C. Therefore, the capacitance of the integrator capacitance CF is twice that of each of the capacitors CS10-CS17.

As can be seen from comparing FIGS. 5 and 9, the A/D conversion circuit 3 of the third embodiment has a similar structure to that of the second embodiment. As shown in FIG. 9, the A/D conversion circuit 3 includes a latch circuit 15, an encoder circuit 16, comparator circuits CMP1-CMP7, and a voltage divider circuit constructed with resistors R0-R7. A difference between the upper and lower reference voltages Vrefp, Vrefm are divided by the voltage divider circuit. A node between the resistors R0, R1 is connected to a non-inverting input terminal of the comparator circuit CMP1. A node between the resistors R1, R2 is connected to a non-inverting input terminal of the comparator circuit CMP2. A node between the resistors R2, R3 is connected to a non-inverting input terminal of the comparator circuit CMP3. A node between the resistors R3, R4 is connected to a non-inverting input terminal of the comparator circuit CMP4. A node between the resistors R4, R5 is connected to a non-inverting input terminal of the comparator circuit CMP5. A node between the resistors R5, R6 is connected to a non-inverting input terminal of the comparator circuit CMP6. A node between the resistors R6, R7 is connected to a non-inverting input terminal of the comparator circuit CMP7. An input voltage is applied through the switch circuit 6 to each inverting input terminal of the comparator circuits CMP1-CMP7.

The operation of the cyclic A/D converter 21 is described below with reference to FIG. 10.

(Amplification Operation)

The control circuit 26 switches the switch circuit 6 to the signal input terminal 2 (i.e., the input signal voltage Vin), switches the switches S10-S15 to the switch circuit 6, switches the switches S16, S17 to the reference voltage line Vref, turns on the switches S18, S20, and turns off the switch S19. As a result, the integrator capacitor CF and the capacitors CS10-CS15 are charged by the input signal voltage Vin, and the capacitors CS16, CS17 are initialized, i.e., discharged to 0 volts.

Then, the control circuit 26 turns off the switches S18, S20, switches the switch circuit 6 to the multiplying D/A converter 22, switches the switches S10-S17 to the reference voltage Vrefm, and turns on the switch S19. Thus, the multiplying D/A converter 22 performs the amplification operation during a period Amp (1) shown in FIG. 10.

Specifically, the capacitor CF is connected between the inverting input terminal and the output terminal of the operational amplifier 23. The charge is redistributed between the capacitors CF, CS10-CS17 in accordance with the following equation:

$$(Cf+6Cs)(Vin-0)=8Cs(0-0)+Cf(Vout-0) \quad (5)$$

In the above equation (5), Cf represents a capacitance of the integrator capacitor CF, Cs represents a capacitance of each of the capacitors CS10-CS17, and Vout represents an output voltage of the multiplying D/A converter 22. As described above, the capacitance of the integrator capacitor CF is twice that of each of the capacitors CS10-CS17. Therefore, Cf=2Cs.

From the equation (5), the output voltage Vout of the multiplying D/A converter 22 is given as follows:

$$Vout=(Cf+6Cs)/Cf \cdot Vin=4Vin \quad (6)$$

Therefore, the input signal voltage Vin is amplified by a gain of four each time passing through the multiplying D/A converter 22.

In this embodiment, the amplification operation is performed twice to amplify the input signal voltage Vin by a high gain. In the second amplification operation, the control circuit 26 turns off the switch S19 to hold the output voltage Vout of the multiplying D/A converter 22. Then, the output voltage Vout is recycled through the switch circuit 6 and the multiplying D/A converter 22 so that the amplification operation is performed twice.

Specifically, in the second amplification operation, the control circuit 26 switches the switches S10-S15 to the switch circuit 6 and turns on the switch S20. As a result, the capacitors CS10-CS15 are charged, and the capacitors CS16, CS17 are initialized. Then, the control circuit 26 turns off the switch S20, switches the switches S10-S17 to the reference voltage line Vrefm, and turns on the switch S19, so that the charge is redistributed during a period Amp(2) shown in FIG. 10. Then, the control circuit 26 turns off the switch S19 to hold the twice amplified voltage. The second amplification operation is finished when the twice amplified voltage is held. As a result, the input signal voltage Vin is amplified by a gain of eight.

(A/D Conversion Operation)

Then, the control circuit 26 outputs the latch signal of high level to the latch circuit 15 so that the A/D conversion circuit 3 outputs the A/D output (i.e., 3-bit digital value) to the control circuit 26. Then, the control circuit 26 switches the switches S10-S15 to the switch circuit 6 and turns on the switch S20. As a result, the capacitor CS10-CS15 are charged by the twice amplified voltage, and the capacitors CS16, CS17 are initialized. When the charging and initializing are completed, the control circuit 26 turns off the switch S20 and turns on the switch S19. Further, the control circuit 26 switches the switches S10-S17 to the reference voltage Vrefp or Vrefm in accordance with the A/D output of the A/D conversion circuit 3. Thus, the charge is redistributed during a period MD/A(1) shown in FIG. 10.

When the charge redistribution is completed, the control circuit 26 turns off the switch S19 to hold the output voltage of the multiplying D/A converter 22. The control circuit 26 causes the output voltage to be recycled through the multiplying D/A converter 22. When the output voltage is recycled through the multiplying D/A converter 22 two (=K−1) times, the A/D conversion circuit 3 performs A/D conversion three (=K) times. Each time the A/D conversion is performed, the A/D output (i.e., 3-bit digital value) of the A/D conversion circuit 3 is added to each other by a shift-adder in the control circuit 26. As a result, the control circuit 26 produces a 6-bit A/D conversion code.

In the cyclic A/D converter 21 according to the third embodiment, the switch S19, the operational amplifier 23, and the integrator capacitor CF work in conjunction with each other to act as a sample and hold circuit, independently of the capacitor array circuit 24. Therefore, the cyclic A/D converter 21 has no need to include a sample and hold circuit. Accordingly, structure of the cyclic A/D converter 21 can be simplified so that precision of the cyclic A/D converter 21 can be improved. Due to the switch S20, the capacitors CS10-CS17 can be charged by the sampled and held voltage so that the circulation operation can be performed.

Fourth Embodiment

Figure 11:
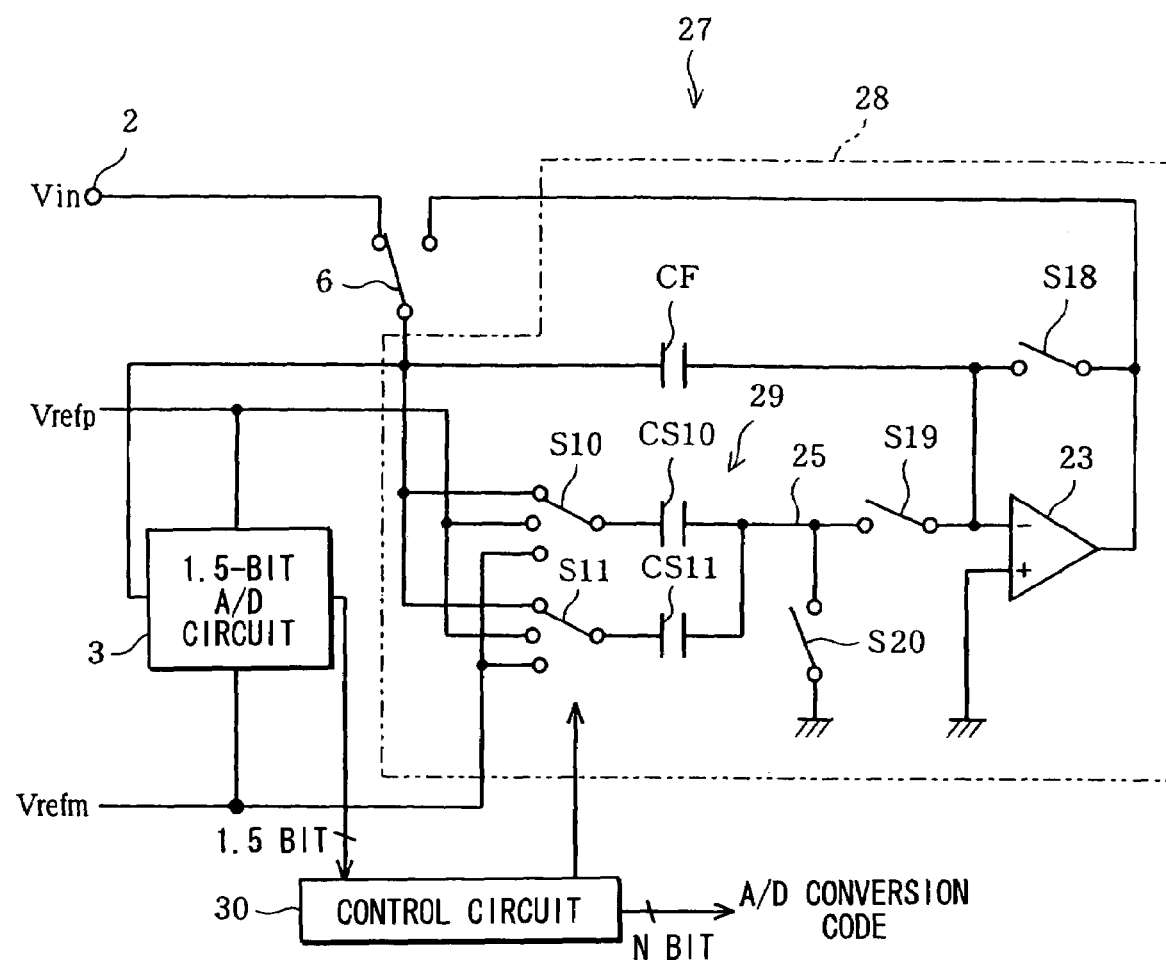
FIG. 11 is a block diagram of a cyclic A/D converter according to a fourth embodiment of the present invention.
Figure 12:
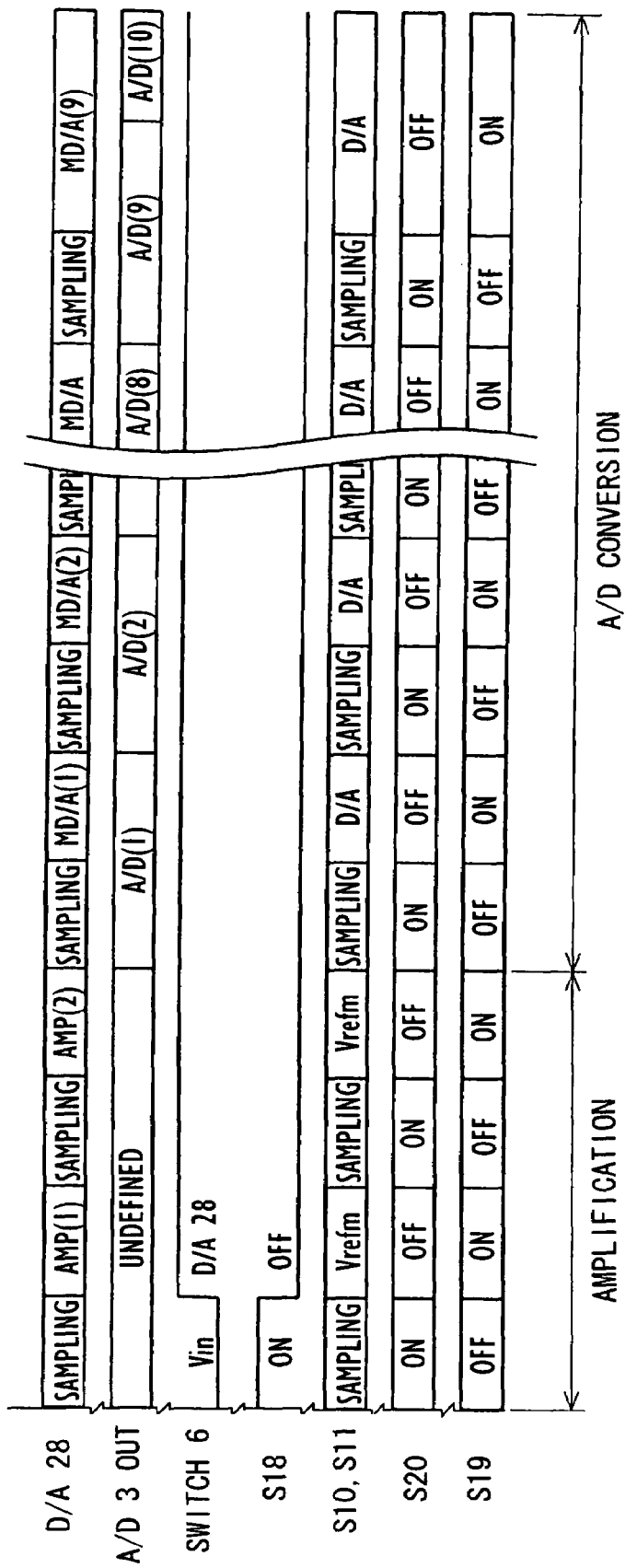
FIG. 12 is a timing diagram of the cyclic A/D converter of FIG. 11.

As shown in FIGS. 11 and 12, a cyclic A/D converter 27 according to a fourth embodiment of the present invention includes a signal input terminal 2, a 1.5-bit A/D conversion circuit 3, a switch circuit 6, a 1.5-bit multiplying D/A converter 28 (i.e., residue voltage generation circuit), and a control circuit 30.

The A/D conversion circuit 3 of the fourth embodiment has the same structure as the A/D conversion circuit 3 shown in FIG. 5. As shown in FIG. 11, the multiplying D/A converter 28 includes a capacitor array circuit 29 constricted with capacitors CS10, CS11. Each of the capacitors CS10, CS11 has a capacitance Cs. A capacitor CF has a capacitance Cf, which is twice the capacitance Cs. In short, Cf=2Cs The operation of the cyclic A/D converter 27 is described below with reference to FIG. 12.

(Amplification Operation)

The control circuit 30 switches the switch circuit 6 to the signal input terminal 2 (i.e., the input signal voltage Vin), switches the switches S10, S11 to the switch circuit 6, turns on the switches S18, S20, and turns off the switch S19. As a result, the capacitors CF, CS10, CS11 are charged by the input signal voltage Vin.

Then, the control circuit 26 turns off the switches S18, S20, switches the switch circuit 6 to the multiplying D/A converter 28, switches the switches S10-S17 to the reference voltage Vrefm, and turns on the switch S19. Thus, the multiplying D/A converter 28 performs the amplification operation during a period Amp (1) shown in FIG. 10.

The charge is redistributed between the capacitors CF, CS10, CS11 in accordance with the following equation:

$$(Cf+2Cs)(Vin-0)=2Cs(0-0)+Cf(Vout-0) \quad (7)$$

In the above equation (7), Vout represents an output voltage of the multiplying D/A converter 28. As described above, Cf=2Cs Therefore, from the equation (7), the output voltage Vout of the multiplying D/A converter 22 is given as follows:

$$Vout=(Cf+2Cs)/Cf \cdot Vin=2Vin \quad (8)$$

Therefore, the input signal voltage Vin is amplified by a gain of two each time passing through the multiplying D/A converter 28.

Like the third embodiment, the amplification operation is performed twice to amplify the input signal voltage Vin by a high gain. Then, an A/D conversion operation is performed in the same manner as the third embodiment.

Fifth Embodiment

Figure 13:
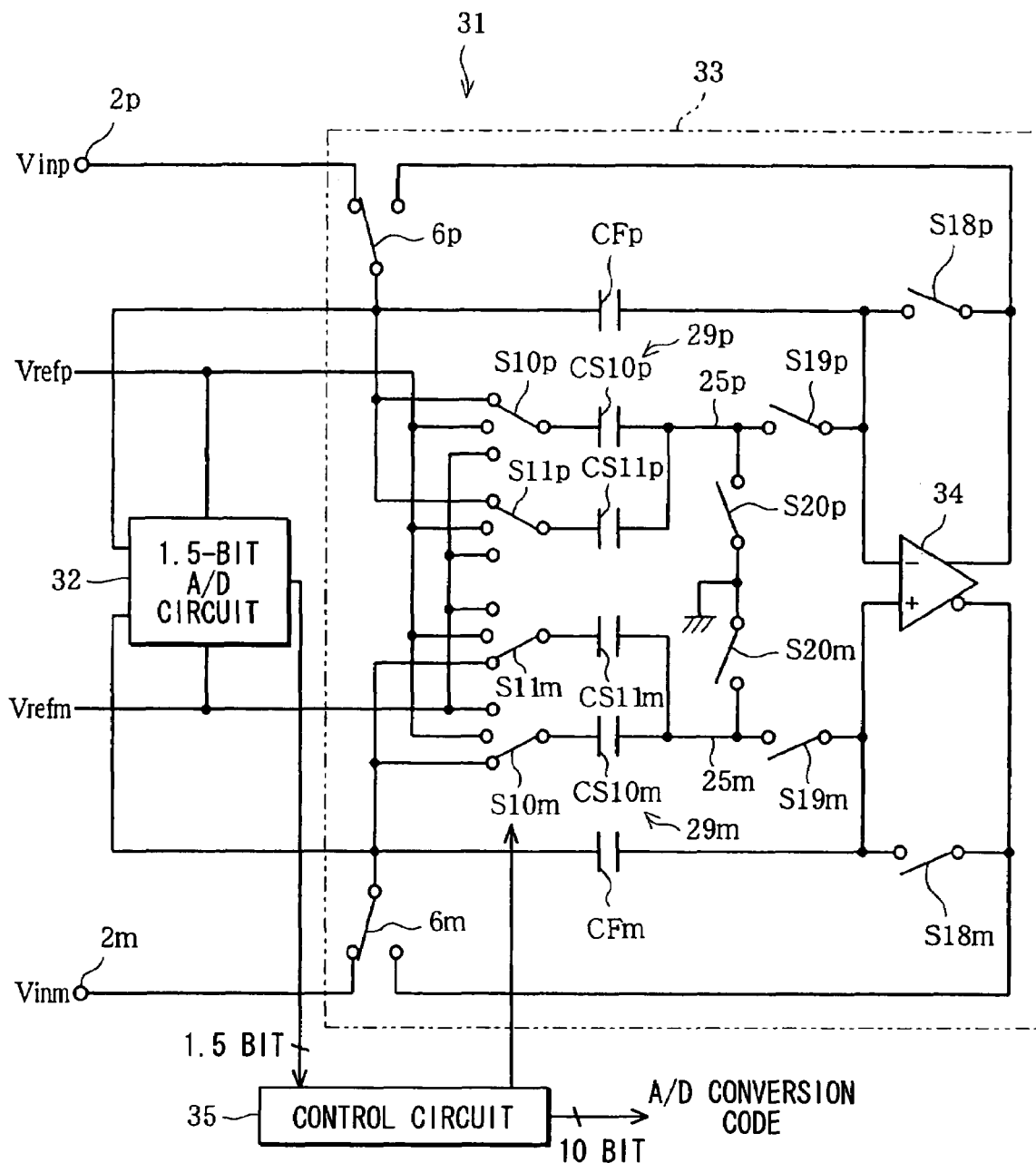
FIG. 13 is a block diagram of a cyclic A/D converter according to a fifth embodiment of the present invention.
Figure 14:
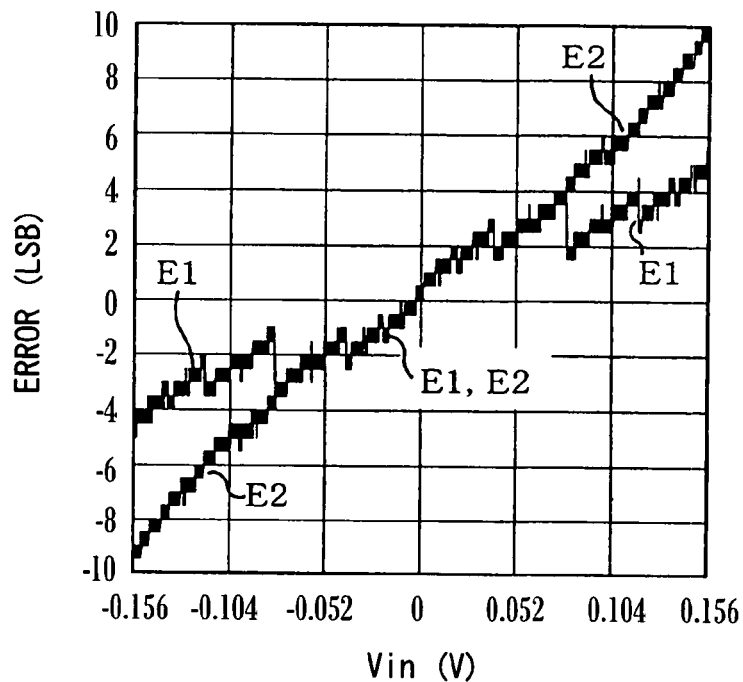
FIG. 14 is a graph showing conversion errors of two types of cyclic A/D converters, one of which is the cyclic A/D converter of FIG. 13 and the other of which is a conventional cyclic A/D converter.

As shown in FIGS. 13 and 14, a 10-bit cyclic A/D converter 31 according to a fifth embodiment of the present invention includes an non-inverting signal input terminal 2p for receiving an non-inverting input signal voltage Vinp, an inverting signal input terminal 2m for receiving an inverting input signal voltage Vinm, a 1.5-bit A/D conversion circuit 32 and a 1.5-bit multiplying D/A converter 33 (i.e., residue voltage generation circuit). The cyclic A/D converter 31 is of differential type, while the cyclic A/D converter 27 shown in FIG. 11 is of single ended type.

An non-inverting input terminal of the A/D conversion circuit 32 is selectively connected through a switch circuit 6p to the non-inverting signal input terminal 2p or an non-inverting output terminal of an operational amplifier 34. Likewise, an inverting input terminal of the A/D conversion circuit 32 is selectively connected through a switch circuit 6m to the inverting signal input terminal 2m or an inverting output terminal of the operational amplifier 34.

A capacitor array circuit 29p is connected through switches S10p, S11p, S19p between the switch circuit 6p and the inverting input terminal of the operational amplifier 34. The capacitor array circuit 29p includes capacitors CFp, CS10p, and CS11p. A first electrode of the capacitor CS10p is selectively connected through the switch S10p to one of reference voltage lines and the switch circuit 6p. The reference voltage lines are connected to an upper reference voltage Vrefp of 5 volts and a lower reference voltage Vrefm of 0 volts, respectively. Likewise, a first electrode of the capacitor CS11p is selectively connected through the switch S11p to one of the reference voltage lines and the switch circuit 6p. Each second electrode of the capacitors CS10p, CS11p is connected through the switch S19p to the inverting input terminal of the operational amplifier 34. A switch S18p is connected between the inverting input and output terminals of the operational amplifier 34.

Likewise, a capacitor array circuit 29m is connected through switches S10m, S11m, S19m between the switch circuit 6m and the non-inverting input terminal of the operational amplifier 34. The capacitor array circuit 29m includes capacitors CFm, CS10m, and CS11m. A first electrode of the capacitor CS10m is selectively connected through the switch S10m to one of the reference voltage lines and the switch circuit 6m. Likewise, a first electrode of the capacitor CS11m is selectively connected through the switch S11m to one of the reference voltage lines and the switch circuit 6m. Each second electrode of the capacitors CS10m, CS11m is connected through the switch S19p to the non-inverting input terminal of the operational amplifier 34. A switch S18m is connected between the non-inverting input and output terminals of the operational amplifier 34.

An A/D output (i.e., 1.5-bit digital value) of the A/D conversion circuit 32 is added to each other by a shift-adder in the control circuit 35. As a result, the control circuit 35 produces a 10-bit A/D conversion code. The cyclic A/D converter 31 operates in a manner similar to that shown in FIG. 12, except the following point. When the charge distribution is performed in the A/D conversion operation, the switches S10p, S11p are switched in accordance with the A/D output of the A/D conversion circuit 32. In contrast, when the charge distribution is performed in the A/D conversion operation, the switches S10m, S11m are switched in accordance with a digital value obtained by subtracting the A/D output of the A/D conversion circuit 32 from two. In such an approach, the switching in the non-inverting side is performed at the same timing as the switching in the inverting side.

FIG. 14 shows conversion errors produced when an input voltage of plus and minus 0.15625 volts (i.e., plus and minus 2.5 volts/16) is converted by two types of cyclic A/D converters with a conversion range of plus and minus 2.5 volts. In FIG. 14, E1 represents a conventional 14-bit cyclic A/D converter that has no amplification function, and E2 represents the 10-bit cyclic A/D converter 31 that has amplification function and amplifies the input voltage by a gain of 16 (i.e., $2^4$). In FIG. 14, each of the capacitors CFp, CFm of the 10-bit cyclic A/D converter 31 has a capacitance one percent larger than a desired value, because manufacturing variation is taken into account.

In an ideal case where there is no gain error and no offset error, the 10-bit cyclic A/D converter 31 can A/D-convert the input voltage with a resolution of 2.5 volts×$2/2^{14}$ (i.e., 2.5 volts×$2/2^{10}$/16). This resolution of 2.5 volts×$2/2^{14}$ corresponds to a resolution of the conventional 14-bit cyclic A/D converter. Therefore, an A/D conversion code produced by the 10-bit cyclic A/D converter 31 can be considered as an A/D conversion code produced by the conventional 14-bit cyclic A/D converter by expanding the A/D conversion code of the 10-bit cyclic A/D converter 31 to MSB (most significant bit) side by four bits.

In practice, the A/D conversion code of the 10-bit cyclic A/D converter 31 has various errors including the gain error and the offset error. As described above, in FIG. 14, manufacturing variation of the capacitors CFp, CFm is taken into account. Manufacturing of a cyclic A/D converter cannot avoid such a manufacturing variation.

As can be seen from FIG. 14, the conventional 14-bit cyclic A/D converter has poor differential non-linearity. Specifically, the graph E1 representing the conventional 14-bit cyclic A/D converter is discontinuous at two points. It is likely that the A/D conversion code is missing at discontinuous at two points. The discontinuous points are caused by the manufacturing variation of the capacitors.

In contrast, in the 10-bit cyclic A/D converter 31 according to this embodiment, the differential non-linearity is greatly improved. The amplification operation provides the improvement in the differential non-linearity. Specifically, although the A/D conversion operation affects the differential non-linearity, the affection is reduced to one-sixteenth of that in the conventional 14-bit cyclic A/D converter due to the fact that the input voltage is amplified by the gain of 16.

Thus, the 10-bit cyclic A/D converter 31 according to this embodiment has good differential non-linearity. Further, the 10-bit cyclic A/D converter 31 is configured in a differential manner. In such an approach, common mode noise can be effectively removed.

Sixth Embodiment

Figure 15:
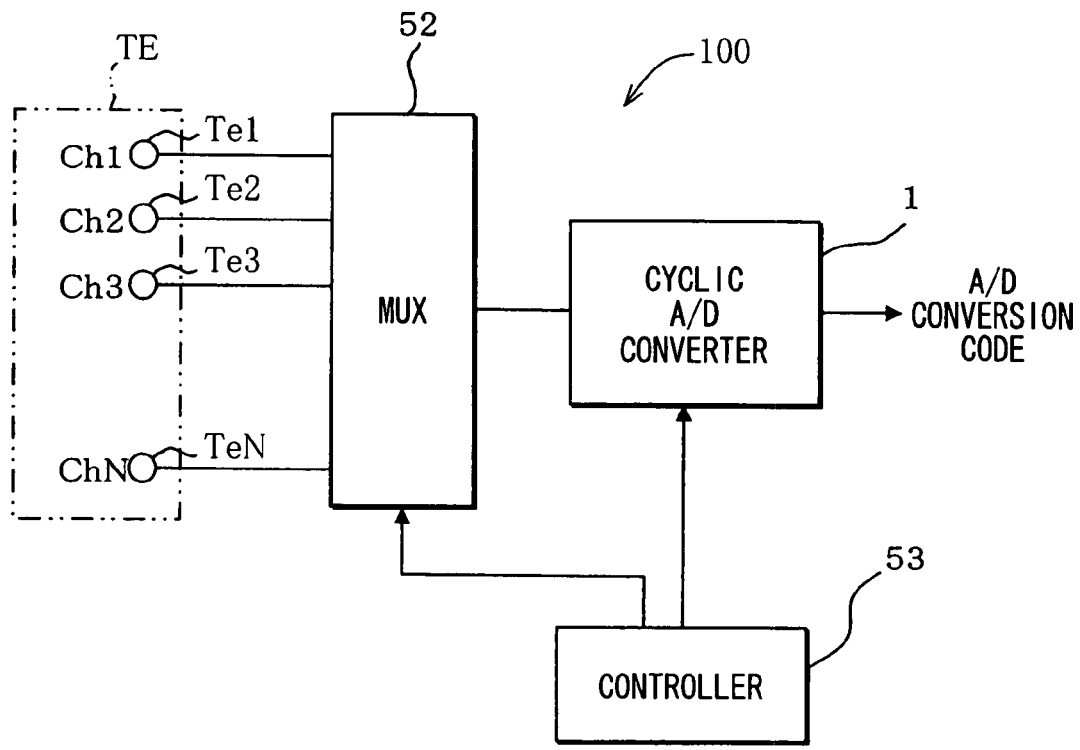
FIG. 15 is a block diagram of a multi-channel A/D conversion system according to a sixth embodiment of the present invention.

As shown in FIG. 15, an A/D conversion system 100 according to a sixth embodiment of the present invention includes a cyclic A/D converter 1, an input section TE, a multiplexer 52, and a controller 53. The A/D conversion system 100 has multiple input channels Ch1-ChN. The input section 51 has multiple input terminals Te1-TeN, each of which is connected to a corresponding one of the input channels Ch1-ChN. Each of the input terminals Te1-TeN receives a different signal. For example, an acceleration sensor is connected to the input terminal Te1 of the channel Ch1, a temperature sensor is connected to the input terminal Te2 of the channel Ch2, and a battery voltage divided by resistors is applied to the input terminal Te3 of the channel Ch3. The controller 53 selects the signals in a time sharing manner by using multiplexer 52. The selected signals are successively A/D-converted by the cyclic A/D converter 1.

For example, an input signal from the acceleration sensor ranges from 0 to 15 millivolts, an input signal from the temperature sensor ranges from 0 to 500 millivolts, the divided battery voltage ranges from 0 to 5 volts. Conventionally, a dynamic range of an A/D converter is fixedly set according to the maximum signal range. In the above case, therefore, the dynamic range is set to from 0 to 5 volts.

In this embodiment, the signals are amplified by a gain varying with the selected channels Ch1-ChN. As described previously, the gain can be adjusted by changing the number of circulations in the cyclic A/D converter 1.

For example, as shown in FIG. 16, the input signal from the acceleration sensor is amplified by a gain of two hundred fifty-six and then A/D-converted by a 10-bit cyclic A/D converter 1. In such an approach, the input signal from the acceleration sensor can be A/D-converted with a resolution of 0.019 millivolts (i.e., 5 volts/1024/256). This resolution of 0.019 millivolts corresponds to a resolution of a 18-bit A/D converter with a dynamic range from 0 to 5 volts.

The input signal from the temperature sensor is amplified by a gain of eight and A/D-converted with a resolution of 0.061 millivolts (i.e., 5 volts/1024/8). The divided battery voltage is amplified by a gain of one and A/D-converted with a resolution of 4.88 millivolts (i.e., 5 volts/1024).

As described above, according to the A/D conversion system 100, the gain varies with the selected channels Ch1-ChN by changing the number of circulations in the cyclic A/D converter 1. In such an approach, the A/D conversion system 100 has no need to include an variable gain operational amplifier provided upstream of an A/D converter and to include multiple A/D converters with different resolutions.

(Modifications)

The embodiment described above may be modified in various ways. For example, the amplification operation may be performed only once or more than twice. In other words, the input signal voltage Vin may pass through the multiplying D/A converter only once or more than twice before the A/D conversion operation. By adjusting the number the input signal voltage Vin passes through the multiplying D/A converter before the A/D conversion operation, the cyclic A/D converter can act as a programmable amplifier circuit with a variable gain.

The gain may be changed each time the voltage signal passes through the multiplying D/A converter. The gain in the amplification operation may be set independently of that in the A/D conversion operation. The gain in the amplification operation may have a value less than 1. For example, in the third embodiment, at least one of the capacitors CF, CS10-CS15 may be charged in the amplification operation. In such an approach, the gain can have a value of 1.5, 2, 2.5, 3, 3.5, 4, 4.5, or 5. Further, at least one of the switches S10-S17 may be switched to the switch circuit 6, not the reference voltage Vrefm, when the charge redistribution is performed in the amplification operation. In such an approach, the gain can have various values including a value less than 1.

The capacitor CF may have a variable capacitance. In this case, the capacitance of the capacitor CF may be different in between the amplification operation and the A/D conversion operation. For example, in the third embodiment, the capacitance of the capacitor CF in the A/D conversion operation may be twice that in the amplification operation. In such an approach, the gain can be increased.

An offset correction voltage may be applied in the amplification operation. For example, in the first embodiment, the M-bit AND signal inputted from the control circuit 7 to the D/A conversion circuit 9 in the amplification operation may have a digital value corresponding to the offset correction voltage, so that the output voltage of the D/A conversion circuit 9 in the amplification operation is set to the offset correction voltage, not 0 volts. In the second embodiment, when the charge redistribution is performed in the amplification operation, the switch S4 may be switched between the reference voltages Vrefp, Vref, according to the offset correction voltage. In the third embodiment, when the charge redistribution is performed in the amplification operation, at least one of the switches S10-S17 may be switched to the reference voltage Vrefp according to the offset correction voltage.

The number of times the input signal voltage Vin is recycled in the amplification operation may be changed and the A/D conversion may be performed even during the amplification operation. In this case, the control circuit determines, based on the A/D output, whether the input signal voltage Vin is amplified to a suitable level for the A/D conversion. When the control circuit determines that the input signal voltage Vin is amplified to the suitable level, the amplification operation may be stopped. The control circuit memories the circulation number and the gain of each circulation and corrects based on the memorized values the A/D output in the A/D conversion operation.

Such changes and modifications are to be understood as being within the scope of the present invention as defined by the appended claims.

What is claimed is:

1. An A/D converter comprising:
   an A/D conversion circuit;
   a residue voltage generation circuit having an input terminal connected to an input of the A/D conversion circuit, the residue voltage generation circuit generating a residue voltage by amplifying a difference between an input voltage applied to the input terminal and a reference analog voltage by a predetermined gain;
   a signal terminal for receiving an external signal voltage;
   a switch circuit having a first end connected to the input terminal of the residue voltage generation circuit and a second end connectable to the signal terminal or an output terminal of the residue voltage generation circuit; and
   a control circuit that performs an amplification operation and an A/D conversion operation followed by the amplification operation,
   wherein in the amplification operation, the control circuit keeps the reference analog voltage at a predetermined voltage level,
   wherein in the amplification operation, the control circuit controls the switch circuit so that the residue voltage generation circuit receives the external signal voltage as the input voltage and outputs an output voltage,
   wherein in the amplification operation, the control circuit controls the switch circuit so that the output voltage is recycled through the switch circuit and the residue voltage generation circuit a first certain number of times to amplify the output voltage;
   wherein in the A/D conversion operation, an analog value into which a digital value outputted from the A/D conversion circuit is converted is used as the reference analog voltage, and
   wherein in the A/D conversion circuit, the control circuit controls the switch circuit so that the amplified voltage is recycled through the switch circuit, the A/D conversion circuit, and the residue voltage generation circuit a second certain number of times to convert the amplified voltage into the digital value.

2. The A/D converter according to claim 1,
   wherein the residue voltage generation circuit includes a capacitor array circuit, an operational amplifier, and an integrator capacitor,
   wherein the capacitor array circuit includes at least one array capacitor that has a first electrode connected to a common line and a second electrode connectable to one of a plurality of reference voltage lines or the first end of the switch circuit,
   wherein the operational amplifier has an input terminal connected to the common line and an output terminal connected to the output terminal of the residue voltage generation circuit,
   wherein the integrator capacitor is connectable between the input and output terminals of the operational amplifier,
   wherein in the amplification operation, the control circuit selects at least one of the array capacitor and the integrator capacitor and controls the switch circuit to charge the selected capacitor by the external signal voltage and to initialize the remaining capacitor,
   wherein in the amplification operation, when the charging by the external signal voltage and the initializing are completed, the control circuit connects the integrator capacitor between the input and output terminals of the operational amplifier and connects the second electrode of the array capacitor to one of the plurality of reference voltage lines so that charge redistribution occurs between the array capacitor and the integrator capacitor to produce the output voltage,
   wherein in the amplification operation, the control circuit controls the switch circuit to charge the selected capacitor by the output voltage to initialize the remaining capacitor,
   wherein in the amplification operation, when the charging by the output voltage and the initializing are completed, the control circuit connects the integrator capacitor between the input and output terminals of the operational amplifier and connects the second electrode of the array capacitor to one of the plurality of reference voltage lines so that charge redistribution occurs between the array capacitor and the integrator capacitor to amplify the output voltage,
   wherein in the A/D conversion operation, the control circuit controls the switch circuit to charge the selected capacitor by the amplified voltage and to initialize the remaining capacitor, and
   wherein in the A/D conversion operation, when the charging by the amplified voltage and the initializing are completed, the control circuit connects the integrator capacitor between the input and output terminals of the operational amplifier and connects the second electrode of the array capacitor to one of the plurality of reference voltage lines according to the digital value outputted from the A/D conversion circuit so that charge redistribution occurs between the array capacitor and the integrator capacitor to convert the amplified voltage into the digital value.

3. The A/D converter according to claim 2,
   wherein the residue voltage generation circuit further includes a first switch connected between the common line and the input terminal of the operational amplifier and a second switch connected between the common line and a voltage line at a predetermined potential,
   wherein in the amplification operation, the control circuit performs the charging and initializing by turning off the first switch and by turning on the second switch and performs the charge distribution by turning on the first switch and by turning off the second switch, and
   wherein in the A/D conversion operation, the control circuit performs the charging and initializing by turning off the first switch and by turning on the second switch and performs the charge distribution by turning on the first switch and by turning off the second switch.

4. The A/D converter according to claim 2, further comprising:
a sample and hold circuit interposed between the residue voltage generation circuit and the switch circuit.

5. The A/D converter according to claim 1,
wherein the gain of the residue voltage generation circuit is variable, and
wherein the control circuit sets the gain of the residue voltage generation circuit independently in the amplification operation and in the A/D conversion operation.

6. The A/D converter according to claim 2,
wherein a capacitance of the integrator capacitor is variable, and
wherein the control circuit sets the capacitance of the integrator capacitor independently in the amplification operation and in the A/D conversion operation.

7. The A/D converter according to claim 1,
wherein the voltage level of the reference analog voltage is fixed to zero volts.

8. The A/D converter according to claim 1,
wherein in the amplification operation, the voltage level of the reference analog voltage varies each time the output voltage of the residue voltage generation circuit is recycled.

9. The A/D converter according to claim 1,
wherein the residue voltage generation circuit includes a D/A conversion circuit that converts the digital value outputted from the A/D conversion circuit into the reference analog voltage, and
wherein in the amplification operation, the control circuit supplies a predetermined digital value to the D/A conversion circuit instead of the digital value outputted from the A/D conversion circuit.

10. The A/D converter according to claim 1,
wherein the A/D conversion circuit, the residue voltage generation circuit, and the switch circuit are configured in a differential manner.

11. The A/D converter according to claim 1, further comprising:
a multiplexer having a plurality of signal channels, each of is connected to the signal terminal,
wherein the control circuit selects one of the plurality of signal channels to receive the external signal voltage, and
wherein the first certain number of times varies with the selected channel.

* * * * *